United States Patent [19]

Morosas

[11] Patent Number: 5,494,098
[45] Date of Patent: Feb. 27, 1996

[54] FAN DRIVEN HEAT SINK

[75] Inventor: Christopher G. Morosas, Sutton, Mass.

[73] Assignee: Wakefield Engineering, Inc., Wakefield, Mass.

[21] Appl. No.: 261,678

[22] Filed: Jun. 17, 1994

[51] Int. Cl.⁶ .................................................. H01L 23/36
[52] U.S. Cl. .................... 165/121; 165/80.3; 165/185; 361/697; 29/890.035
[58] Field of Search ................................ 165/80.3, 122, 165/121, 185; 361/697, 709; 29/890.035

[56] References Cited

U.S. PATENT DOCUMENTS

| | | | |
|---|---|---|---|
| 3,592,260 | 7/1971 | Berger | 165/121 |
| 4,513,812 | 4/1985 | Papst et al. | 165/80.3 |
| 4,790,373 | 12/1988 | Raynor et al. | 165/185 |
| 4,884,631 | 12/1989 | Rippel | 165/185 |
| 5,000,254 | 3/1994 | Williams . | |
| 5,287,249 | 2/1994 | Chen . | |
| 5,297,617 | 3/1994 | Herbert . | |
| 5,299,632 | 4/1994 | Lee . | |
| 5,309,983 | 5/1994 | Bailey . | |
| 5,368,094 | 11/1994 | Hung | 165/80.3 |

*Primary Examiner*—Allen J. Flanigan
*Attorney, Agent, or Firm*—Blodgett & Blodgett

[57] ABSTRACT

A fan driven heat sink assembly which includes a fan assembly mounted on a heat sink for mounting on a microprocessor unit. The heat sink has a solid flat base, a plurality of spaced cooling fins and a housing which is fixed to the base. The cooling fins are fixed to the base and extend from one flat surface of the base to a top wall of the housing. The top wall of the housing has an aperture which is aligned with an outlet opening of the fan assembly. The fins extend from a first end opening at one end of the housing to a second end opening at the opposite end of the housing. Airflow from the fan assembly extends from the opening in the top wall of the housing along the spaces between the fins and out through both end openings of the housing.

12 Claims, 2 Drawing Sheets

FAN DRIVEN HEAT SINK

BACKGROUND OF THE INVENTION

The present invention is generally directed to a heat sink assembly for the removal of heat from a heat generating electronic device such as a microprocessor. The present invention is directed more specifically to a heat sink assembly which includes a small electric fan for creating an airflow along and through the heat transfer surface area of the heat sink.

A typical heat sink includes a solid base and a plurality of fins or pins which extend from the base. Heat is dissipated from the heat sink by free convection. The surface heat transfer characteristics of the heat sink are further enhanced by forced convection. In forced convection, an airflow is directed along and through the heat transfer surface element of the heat sink. Initially, forced convection was achieved by the implementation of blowers or fans within the cabinet or housing of a computer system. The advent of more powerful and high heat generating microprocessors rendered a general forced convection system obsolete. In order to cool the new microprocessors adequately, more sophisticated multiple level fan systems were required. This creates additional noise and consumption of space at the expense of electronic components. Also, the new systems were no longer reliable. These problems were solved to some degree by the development of fan driven heat sink packages. Such a package includes a fan which is mounted directly to a heat sink which, in turn, is mounted to a microprocessor. In one type of fan driven heat sink package, some of the fins or portions of the fins are removed to create a space for the fan. This saves space and enables the fan to be positioned close to the base of the heat sink. However, the loss of fin area and the limitation of airflow to the base and to the lower portions of the fins results in a substantial loss in cooling efficiency. For other fan driven heat sink assemblies, the fan is mounted directly on top of the fins or pins of the heat sink. In this type of assembly, air from the fan is directed to the pins or fins which are located below the fan at an initial air velocity. Air from the fan can exit the assembly quite readily through the spaces between the fins or pins just outside of the fan housing. Very little airflow is developed along the fins or pins and the airflow has very little velocity. The prior art fan driven heat sink assemblies have provided minimal improvement in cooling efficiency over general fan driven forced convection systems. These and other difficulties experienced with the prior art devices have been obviated by the present invention.

It is, therefore, a principle object of the present invention to provide a fan driven heat sink assembly which is capable of developing a substantial air pressure between the fan and the heat sink and capable of developing a high uniform velocity airflow along the surfaces of the fins of the heat sink to provide substantial improvement in heat dissipation efficiency.

Another object of the invention is to provide fan driven heat sink assembly which has a substantially higher fin surface area, which enhances the heat dissipation efficiency which is created by the positive or forced convection airflow along the surfaces of the fins.

A further object of the invention is the provision of a method of making a fan driven heat sink assembly which results in a higher cooling fin density and increased fin surface area.

With these and other objects in view, as will be apparent to those skilled in the art, the invention resides in the combination of parts set forth in the specification and covered by the claims appended hereto.

SUMMARY OF THE INVENTION

In general, the invention consists of a fan driven heat sink assembly which includes a fan assembly which is mounted on a heat sink which is adapted to be mounted on a microprocessor unit. The heat sink has a solid flat base and a housing which is fixed to the base and which has a top wall that is spaced from the base. A plurality of spaced parallel fins are fixed to the base and extend from the upper flat surface of the base to the top wall of the housing. The top wall of the housing has an aperture which is aligned with an outlet opening of the fan assembly. The fins extend from a first end opening at one end of the housing to a second end opening at the opposite end of the housing. Airflow from the fan assembly extends from the opening in the top wall of the housing along the spaces between the fins and out through both end openings of the housing. More specifically, the portions of the upper ends of the fins which are just below the aperture are spaced from the top wall of the housing to define a plenum chamber beneath the fan assembly.

BRIEF DESCRIPTION OF THE DRAWINGS

The character of the invention, however, may best be understood by reference to one of its structural forms, as illustrated by the accompany drawings, in which.

DESCRIPTION OF THE PREFERRED EMBODIMENT

Figure 1:
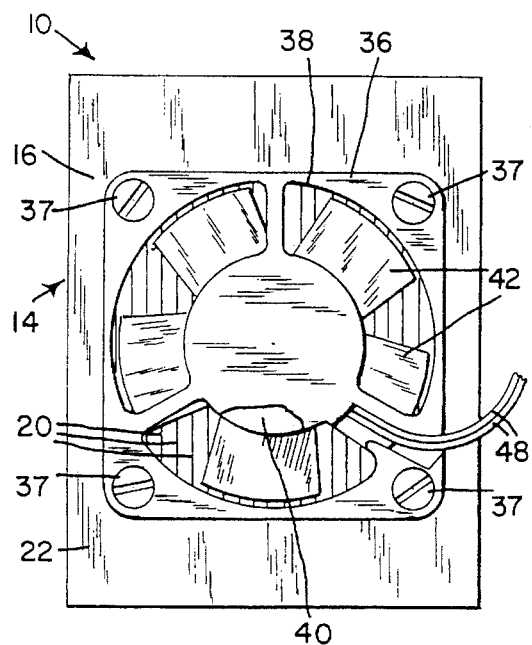
FIG. 1 is a top plan view of a heat sink assembly embodying the principles of the present invention.
Figure 3:
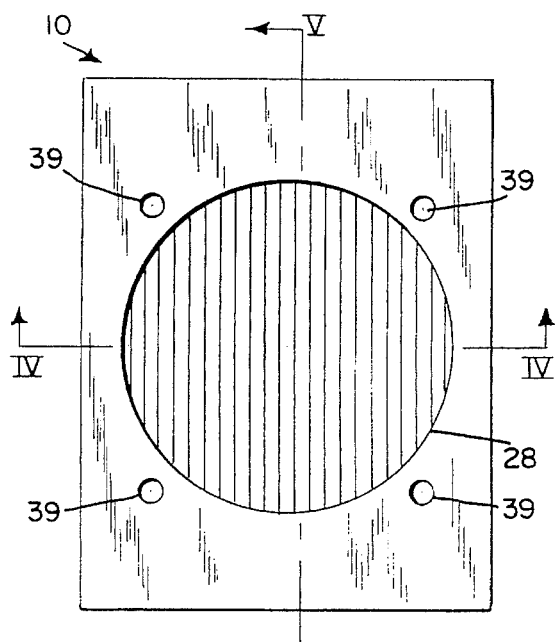
FIG. 3 is a top plan view of the heat sink assembly without the fan assembly which is one of the components of the heat sink assembly.
Figure 2:
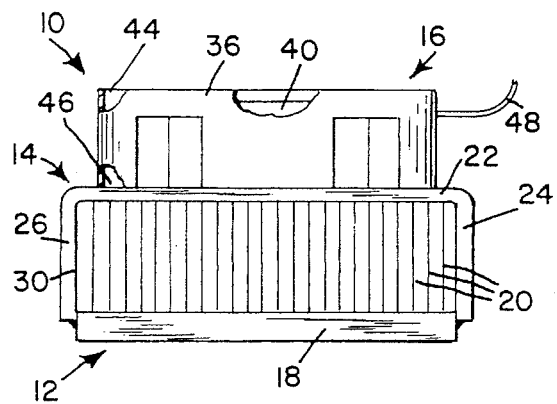
FIG. 2 is a from elevation of the heat sink assembly.

Referring to the drawings, the heat sink assembly of the present invention is generally indicated by the reference numeral 10. The assembly 10 includes a heat sink which is generally indicated by the reference numeral 12, a housing which is generally indicated by the reference numeral 14 and a fan assembly which is generally indicated by the reference numeral 16.

The heat sink comprises a solid generally rectangular base 18 and a plurality of spaced parallel fins 20 which are fixed to the top surface of the base and which extend upwardly from the base.

Figure 4:
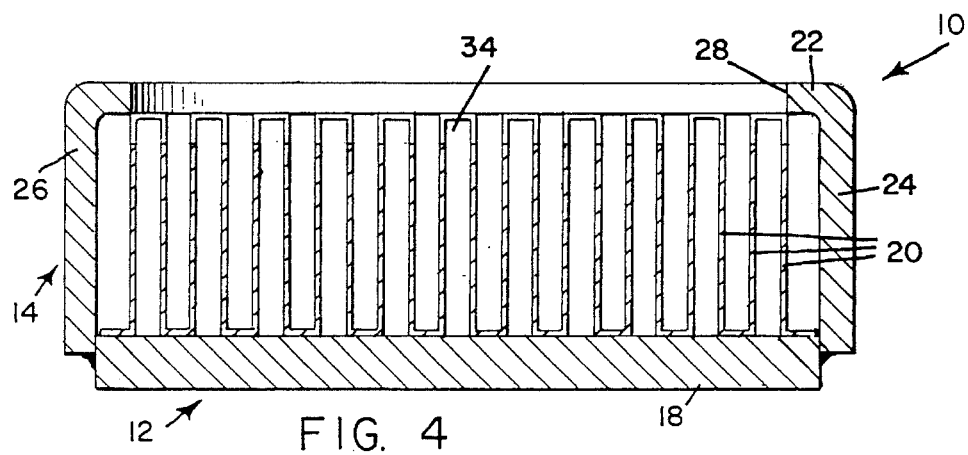
FIG. 4 is a vertical cross-sectional view on an enlarged scale of the heat sink assembly taken along the line IV—IV of FIG. 3.
Figure 5:
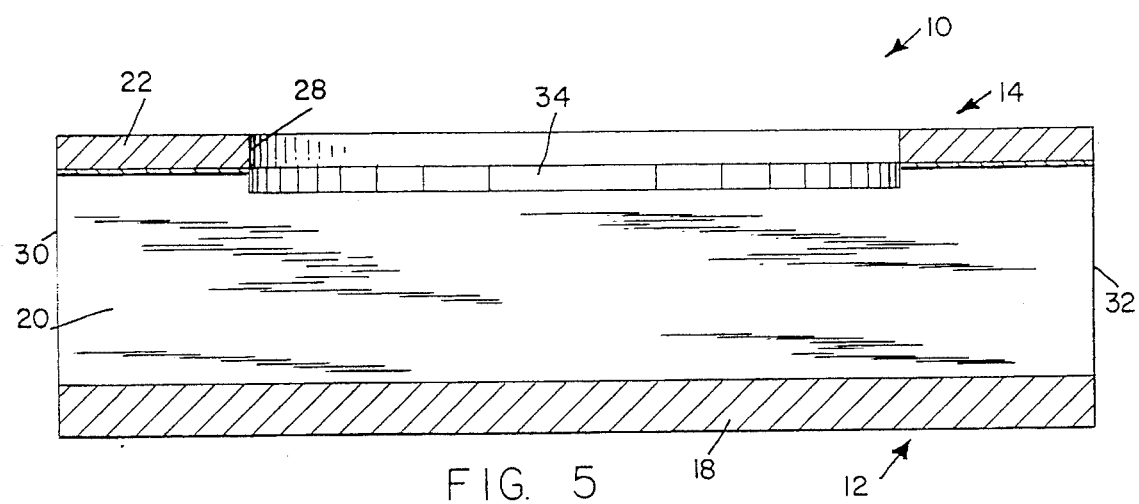
FIG. 5 is a vertical cross-sectional view on an enlarged scale of the heat sink assembly taken along the line V—V of FIG. 3.

The housing 14 has an inverted U-shaped cross-sectional configuration and includes a top wall 22 and a pair of side walls 24 and 26. The lower ends of the side walls 24 and 26 are fixed to the base 18 of the heat sink. The top wall 22 has a circular opening or aperture 28. The top wall 22 and the base 18 and the side walls 24 and 26 define a generally rectangular first end opening 30 and a generally rectangular second end opening 32, see FIG. 5. The fins 20 are fixed at their lower ends to the base 18 and at their upper ends to the top wall 22, except for the circular opening 28. In addition, the upper ends of the portions of the fins 20 which are vertically aligned with the opening 28 are spaced from the top wall 22 and define a plenum chamber 34 below the opening 28. The fins 20 are preferably made from a single continuous sheet of heat conductive and heat dissipating material which is bent into a sinuous or serpentine configuration as shown in FIG. 4. The bottom loops of the material are fixed to the upper surface of the base 18. The upper loops of the material are fixed to the bottom surface of the top wall 22 of the housing. The portions of the top loops of the fin material which are located directly below the opening 28 are severed. The upper ends of the severed portions of the fins are located in a horizontal plane which is spaced below the horizontal plane of the bottom surface of the top wall 22, as shown in FIGS. 4 and 5, to form the plenum chamber 34.

The fan assembly 16 includes a fan housing 36 which is fixed to the wall 22 by screws 37. The screws 37 are threaded into threaded holes 39 in the top wall 22. The fan housing 36 has a circular bore 38 which has a circular top opening 44 and a circular bottom opening 46. The bore 38 and the openings 44 and 46 are vertically aligned with the top opening 28 in the top wall 22. A rotor 40 is located within the bore 38 and is supported by the housing 36 for rotation about a vertical axis. A plurality of fan blades 42 are fixed to the rotor 40 and extend radially from the rotor within the bore 38. The rotor 40 is electrically driven and is operatively connected to a source of electrical power, not shown, by a pair of wires 48. The bottom opening 46 is at the top surface of the top wall 22 and fan blades 42 are very close to the bottom opening 46. During operation of the invention, the rotor 40 is rotated so that the blades 42 draw ambient air into the bore 38 through the top opening 44. The air is forced against the tops of the exposed fins 20 which are located below the opening 28. Pressurized air from the fan enters plenum chamber 34 which helps to distribute the pressurized air evenly in all of the spaces between the fins 20 and a high velocity air flow is created in the spaces between the fins 20. Air flows from the plenum chamber 34 to the first and second end openings 30 and 32, respectively. The combination of high fin surface area and high airflow velocity is very effective in removing heat by active convection from the heat sink 12.

The heat sink assembly 10 is constructed by folding a predetermined length of thermally conductive material such as aluminum, aluminum alloy or copper strip into the serpentine configuration shown in FIG. 4 to form the fins 20. The fins 20 are positioned on a solid block of aluminum or aluminum alloy which serves as the base 18. A section of U-shaped aluminum or aluminum alloy channel material is placed on top of the fins in an inverted position so that the legs of the channel member overlap the side edges of the base 18 as shown in FIG. 4 to define the housing 14. The opening 28 and the tapped holes 39 can be formed prior to assembly or after. After housing 14 and the fins 20 have been positioned relative to the base 18 as shown in FIG. 4, these elements are brazed or otherwise bonded, i.e. epoxy, together to form an integral unit. The top portions of the fins 20 which are vertically aligned with the opening 28 are then milled to form the plenum chamber 34. Thereafter, the fan assembly is attached to the top wall 22 to complete the heat sink assembly 10.

Figure 6:
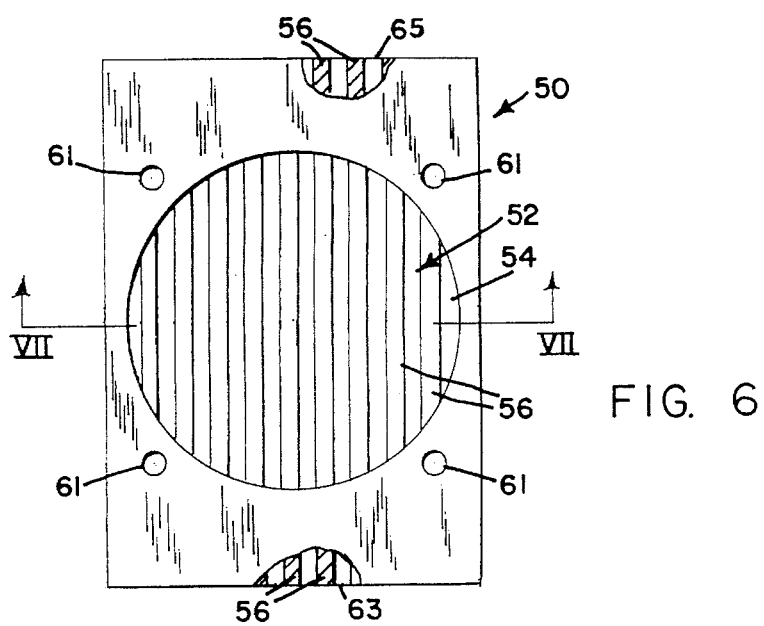
FIG. 6 is a top plan view of a modified heat sink assembly without the fan assembly.
Figure 7:
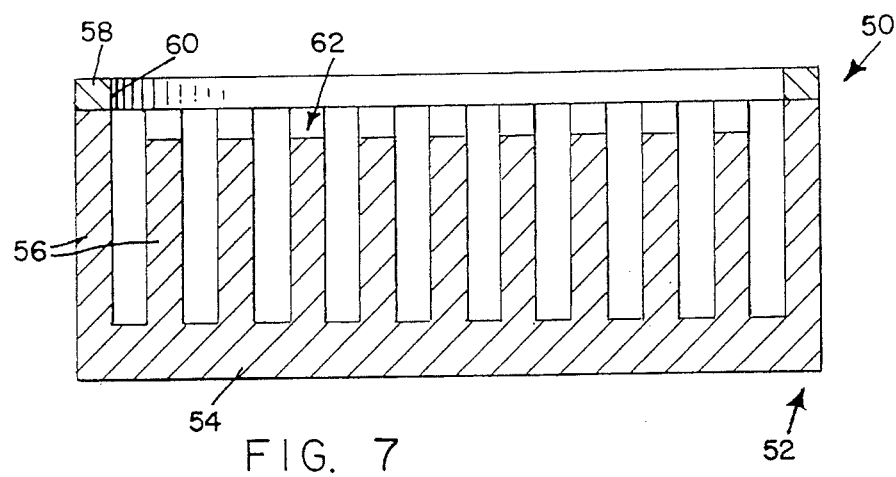
FIG. 7 is a vertical cross-sectional view on an enlarged scale taken along the line VII—VII of FIG. 6.

Referring to FIGS. 6 and 7, there is shown a modified fan driven heat sink assembly which is generally indicated by the reference numeral 50. The assembly 50 includes a conventional heat sink which is generally indicated by the reference numeral 52 and a flat top plate 58. The heat sink 52 includes a solid base portion 54 and a plurality of spaced parallel fins 56 which extend upwardly from the upper surface of the base .54. The top plate 58 is brazed to the top edges of the fins 56 so that it is spaced from the base 54. The top plate 58 has a central circular opening or aperture 60 and a plurality of threaded apertures 61 for receiving the screws 37 of the fan assembly 16. The upper portions of the fins 56 which lie beneath the circular opening 60 are milled to a level which is below the bottom surface of the top plate 58. This creates a plenum chamber 62 beneath the fan assembly 16 when the fan assembly is mounted to the top plate 58. The assembly 50 functions in the same manner as the assembly 10. Air from the fan assembly 12 enters the plenum chamber 62 through the opening 60. Super atmospheric air from the fan enters plenum chamber 62 and air flows uniformly from the chamber 62 at a substantial velocity along the channels which are defined by the spaced fins 56 to first and second end openings 63 and 65, respectively, at the outer ends of the fins 56.

Clearly, minor changes may be made in the form and construction of this invention without departing from the material spirit thereof. It is not, however, desired to confine the invention to the exact form herein shown and described, but it is desired to include all such as properly come within the scope claimed.

The invention having been thus described, what is claimed as new and desired to secure by Letters Patent is:

1. A heat sink assembly for use in removal of heat from a heat generating electronic device, said heat sink assembly comprising:

(a) a solid flat base;

(b) a housing which is fixed relative to said base, said housing having a top wall which is spaced from said base, and side walls which extend from said base to said top wall, a first end opening at a first end of said base which is defined by said base, side walls and top wall, a second end opening which is defined by said base, side walls and top wall at a second end of said base which is opposite said first end opening, and an aperture in said top wall which is spaced from said first and second end openings;

(c) a plurality of parallel spaced fins which are fixed to said base, said fins extending from said base to said top wall, said fins defining with said base and said top wall a plurality of channels which extends from said first end opening to said second end opening, the portions of said channels which lie beneath said aperture being open to said aperture; and (d) a fan assembly which is fixed to said top wall above said aperture for blowing air through said aperture and creating an airflow through said channels from said aperture to each of said first and second end openings.

2. A heat sink assembly as recited in claim 1, wherein said fan assembly comprises:

(a) a fan housing which is fixed to said top wall, said fan housing having a bottom opening at said aperture and a top opening; and (b) a rotor which has at least one fan blade, said rotor being rotatably mounted within said fan housing between said bottom and top openings.

3. A method of forming a fan driven heat sink assembly comprising the following steps:

(a) folding a length of sheet metal into a continuous serpentine configuration to define a fin assembly which has a plurality of spaced parallel fins, each of said fins being connected to a first adjacent fin by a first end loop at a first end of said fins and connected to a second adjacent fin by a second end loop at a second end of said fins which is opposite said first end;

(b) positioning said fin assembly on the upper surface of a flat metal base so that the first end loops rest on said upper surface and said fins extend vertically from said base;

(c) positioning an inverted U-shaped metal housing on top of the second loops of said fin assembly, said housing having a flat horizontal top wall which rests on said second loop and a pair of vertical legs which lie outside of said pin assembly and which abut said base;

(d) fixing the fin assembly to the top wall of the housing and to the base and fixing the legs of the housing to the base;

(e) forming an aperture in the top wall of the housing to expose portions of said second loops;

(f) severing the exposed portions of said second loops which are below said apertures to expose the spaces between the fins which are below the severed portions of said second loops to said aperture; and (g) attaching a fan assembly to said top wall above said aperture for blowing air through said aperture against said fins and creating an airflow in the spaces between said fins.

4. A method of forming a fan driven heat sink assembly as recited in claim 3, wherein said fins are fixed to said top wall and to said base by brazing and the legs of said housing are fixed to said base by brazing.

5. A method of forming a fan driven heat sink assembly as recited in claim 3, wherein said housing, said fin assembly and said base are formed essentially of aluminum.

6. A method of forming a fan driven heat sink assembly as recited in claim 3, wherein the upper end portions of said fins are severed are located in a horizontal plane which is spaced from the top wall of said housing to define a plenum chamber below said aperture.

7. A heat sink assembly for use in removal of heat from a heat generating electronic device, said heat sink assembly comprising:

(a) a flat base wall;

(b) a housing which is fixed relative to said base wall, said housing having a top wall which is spaced from said base wall, and side walls which extend from said base wall to said top wall, a first end opening at a first end of said base wall which is defined by said base wall, said side walls and said top wall, a second end opening which is defined by said base wall, said side walls and said top wall at a second end of said base wall which is opposite said first end, and an aperture in said top wall which is spaced from said first and second end openings;

(c) a plurality of parallel spaced fins which are fixed to said base wall, said fins extending from said base wall to said top wall, said fins defining with said base and said top wall a plurality of channels which extends from said first end opening to said second end opening, the portions of said channels which lie beneath said aperture being open to said aperture; and (d) a fan assembly which is fixed to said top wall above said aperture for blowing air through said aperture and creating an airflow through said channels from said aperture to each of said first and second end openings, said fan assembly comprising:

(1) a fan housing which is fixed to said top wall, said fan housing having a bottom opening at said aperture and a top opening; and (2) a rotor which has at least one fan blade, said rotor being rotatably mounted within said fan housing between said bottom and top openings, said fan blade being spaced from the fins so as to define a plenum chamber between said blade and said fins.

8. A heat sink assembly as recited in claim 7, wherein the portions of said fins which are directly below said aperture are below the level of said top wall and are vertically spaced from said aperture.

9. A heat sink assembly for use in removal of heat from a heat generating electronic device, said heat sink assembly comprising:

(a) a flat base wall;

(b) a housing which is fixed relative to said base wall, said housing having a top wall which is spaced from said base wall, and side walls which extend from said base wall to said top wall, a first end opening at a first end of said base wall which is defined by said base wall, said side walls and said top wall, a second end opening which is defined by said base wall, said side walls and said top wall at a second end of said base which is opposite said first end, and an aperture in said top wall which is spaced from said first and second end openings;

(c) a plurality of parallel spaced fins which are fixed to said base wall, said fins extending from said base wall to said top wall, said fins defining with said base wall and said top wall a plurality of channels which extends from said first end opening to said second end opening, the portions of said channels which lie beneath said aperture being open to said aperture, said fins being a single continuous length of material which extends transversely of said channels, each of said fins having an upper end which is connected to the upper end of an adjacent fin and a lower end which is connected to the lower end of a different adjacent fin, the portions of said fins which are vertically aligned with said aperture being unconnected at their upper ends so that all of said channels are operatively connected to said aperture; and (d) a fan assembly which is fixed to said top wall above said aperture for blowing air through said aperture and creating an airflow through said channels from said aperture to each of said first and second end openings.

10. A method of forming a fan driven heat sink assembly comprising the following steps:

(a) forming a heat sink body having a solid base which has a flat horizontal upper surface, said heat sink body having a plurality of spaced parallel fins which are fixed to the base and which extend vertically from said upper surface to upper free ends;

(b) fixing a flat plate to the upper free ends of said fins to form airflow channels which extend from a first end of said plate to a second end of said plate;

(c) forming an aperture in said plate which is spaced from said first and second ends to expose portions of the upper ends of said fins so that portions of said airflow channels are open to said aperture;

(d) reducing the height of the portions of said fins which are vertically aligned with said aperture relative to the remaining portions of said fins to form a plenum chamber below said aperture; and (e) attaching a fan assembly to said plate, said fan assembly having an outlet opening for airflow which is created by said fan assembly, said outlet opening being operatively connected to said aperture so that air flow from said fan assembly enters said airflow channels from said aperture and proceeds along said airflow channels to each of said first and second ends.

11. A heat sink assembly for use in removal of heat from a heat generating electronic device, said heat sink assembly comprising:

(a) a solid flat base;

(b) a plurality of spared substantially parallel fins which extends vertically from said base to define a plurality of channels between said fins, each of said fins having a lower end which is fixed to said base and an upper end, each of said fins extending horizontally from a first end to a second end, each of said channels having a first end opening at said first end and a second end opening at said second end;

(c) a flat top wall which is fixed relative to said fins and said flat base and abuts the upper ends of said fins, said top wall being parallel to the base and extending from said first end opening to said second end opening, said top wall having an aperture for providing an inlet opening to each of said channels, mid aperture being spaced substantially from each of said first and second end openings so that the portions of each of said channels which extends from each of said first and second end openings to said aperture is a tubular duct which is defined by two adjacent fins, said bottom wall and said top wall; and (d) a fan assembly which is operatively connected to said aperture for blowing air through said aperture and for creating an airflow within said channels from said aperture to each of said first and second openings.

12. A heat sink as recited in claim 11, wherein each of said first and second outlet openings is defined by said first and last of said plurality of fins, said base and said top wall.

* * * * *